(12) United States Patent
Reuter et al.

(10) Patent No.: US 9,355,876 B2
(45) Date of Patent: May 31, 2016

(54) PROCESS LOAD LOCK APPARATUS, LIFT ASSEMBLIES, ELECTRONIC DEVICE PROCESSING SYSTEMS, AND METHODS OF PROCESSING SUBSTRATES IN LOAD LOCK LOCATIONS

(71) Applicant: Applied Materials, Inc., Santa Clara, CA (US)

(72) Inventors: Paul B. Reuter, Austin, TX (US); Ganesh Balasubramanian, Fremont, CA (US); JuanCarlos Rocha-Alvarez, San Carlos, CA (US); Jeffrey B. Robinson, San Jose, CA (US); Dale Robert du Bois, Los Gatos, CA (US); Paul Connors, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/203,098

(22) Filed: Mar. 10, 2014

(65) Prior Publication Data
US 2014/0262036 A1 Sep. 18, 2014

Related U.S. Application Data

(60) Provisional application No. 61/786,990, filed on Mar. 15, 2013.

(51) Int. Cl.
*B23Q 3/16* (2006.01)
*H01L 21/67* (2006.01)

(52) U.S. Cl.
CPC ...... *H01L 21/6719* (2013.01); *H01L 21/67201* (2013.01); *Y10T 29/49998* (2015.01)

(58) Field of Classification Search
CPC .................................................. H01L 21/67201
See application file for complete search history.

(56) References Cited

U.S. PATENT DOCUMENTS

| 5,855,681 A | 1/1999 | Maydan et al. |
| 5,951,770 A | 9/1999 | Perlov et al. |

(Continued)

FOREIGN PATENT DOCUMENTS

| WO | WO 01-04387 | 1/2001 |
| WO | WO 2012-118897 A2 | 9/2012 |

OTHER PUBLICATIONS

Merry et al., U.S. Appl. No. 14/180,954, titled: "Semiconductor Device Manufacturing Platform With Single and Twinned Processing Chambers," filed Feb. 14, 2014.

(Continued)

*Primary Examiner* — Parviz Hassanzadeh
*Assistant Examiner* — Nathan K Ford
(74) *Attorney, Agent, or Firm* — Dugan & Dugan, PC

(57) ABSTRACT

A process load lock apparatus is disclosed. The process load lock apparatus includes a load lock chamber adapted to couple between a mainframe section and a factory interface, the load lock chamber including an entry and an exit each having a slit valve, and a load lock process chamber located at a different level than the load lock chamber at the load lock location wherein the load lock process chamber is adapted to carry out a process on a substrate, such as oxide removal or other processes. Systems including the process load lock apparatus and methods of operating the process load lock apparatus are provided. A lift assembly including a containment ring is also disclosed, as are numerous other aspects.

17 Claims, 15 Drawing Sheets

(56) References Cited

U.S. PATENT DOCUMENTS

| | | | |
|---|---|---|---|
| 6,053,686 | A | 4/2000 | Kyogoku |
| 6,173,938 | B1 | 1/2001 | McAndrew |
| 6,182,376 | B1 * | 2/2001 | Shin ................. H01L 21/67109 34/412 |
| 6,287,386 | B1 | 9/2001 | Perlov et al. |
| 6,347,918 | B1 | 2/2002 | Blahnik |
| 6,468,353 | B1 | 10/2002 | Perlov et al. |
| 6,575,737 | B1 | 6/2003 | Perlov et al. |
| 6,656,840 | B2 | 12/2003 | Rajagopalan et al. |
| 6,764,265 | B2 | 7/2004 | Kunze et al. |
| 6,916,397 | B2 | 7/2005 | Pfeiffer et al. |
| 7,007,919 | B2 | 3/2006 | Blonigan et al. |
| 7,658,802 | B2 | 2/2010 | Fu et al. |
| 7,720,655 | B2 | 5/2010 | Rice |
| 8,293,016 | B2 | 10/2012 | Bahng et al. |
| 2002/0127853 | A1 * | 9/2002 | Hubacek et al. ............. 438/689 |
| 2002/0170672 | A1 | 11/2002 | Perlov et al. |
| 2005/0072716 | A1 | 4/2005 | Quiles et al. |
| 2007/0292244 | A1 | 12/2007 | Moore et al. |
| 2009/0108544 | A1 | 4/2009 | Sico et al. |
| 2010/0288728 | A1 * | 11/2010 | Han ........................ H01J 37/20 216/41 |
| 2011/0049100 | A1 * | 3/2011 | Han et al. ........................ 216/67 |
| 2012/0003063 | A1 | 1/2012 | Gage et al. |
| 2012/0322015 | A1 * | 12/2012 | Kim .................................. 432/1 |

OTHER PUBLICATIONS

Hongkham et al., U.S. Appl. No. 14/202,763, titled: "Processing Systems, Apparatus, and Methods Adapted to Process Substrates in Electronic Device Manufacturing," filed Mar. 10, 2014.

Deshmukh et al., U.S. Appl. No. 14/201,892, titled: "UV-Assisted Reactive Ion Etch for Copper," filed Mar. 9, 2014.

Deshmukh et al., U.S. Appl. No. 14/200,779, titled: "Pulsed DC Plasma Etching Process and Apparatus," filed Mar. 7, 2014.

International Search Report and Written Opinion of International Application No. PCT/US2014/022741 mailed Jun. 24, 2014.

International Preliminary Report on Patentability and Written Opinion of International Application No. PCT/US2014/022741 mailed Sep. 24, 2015.

* cited by examiner

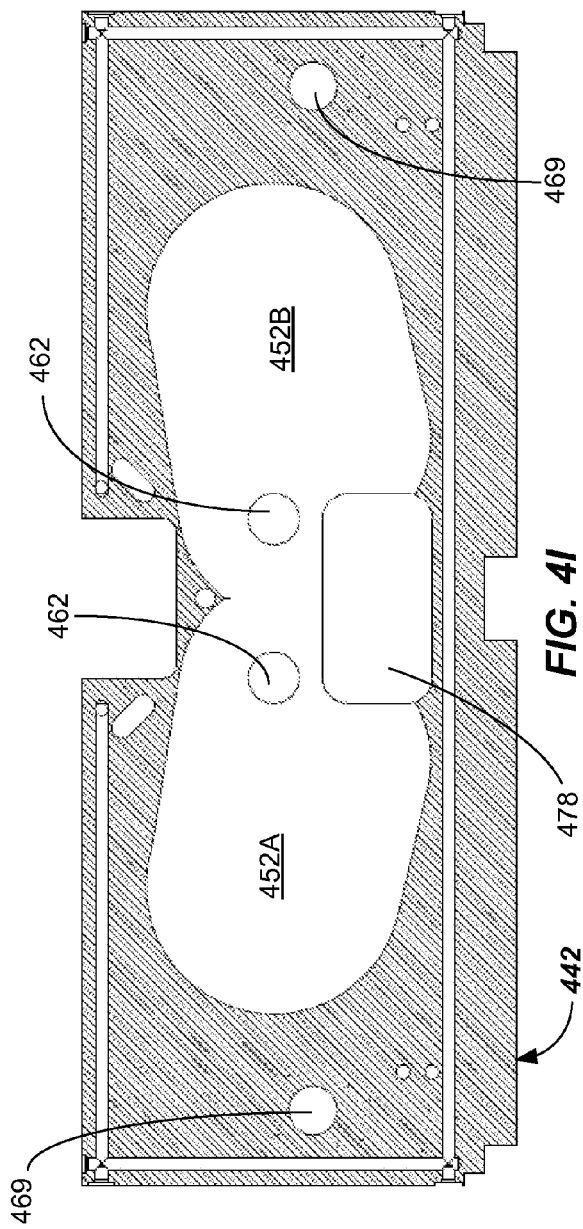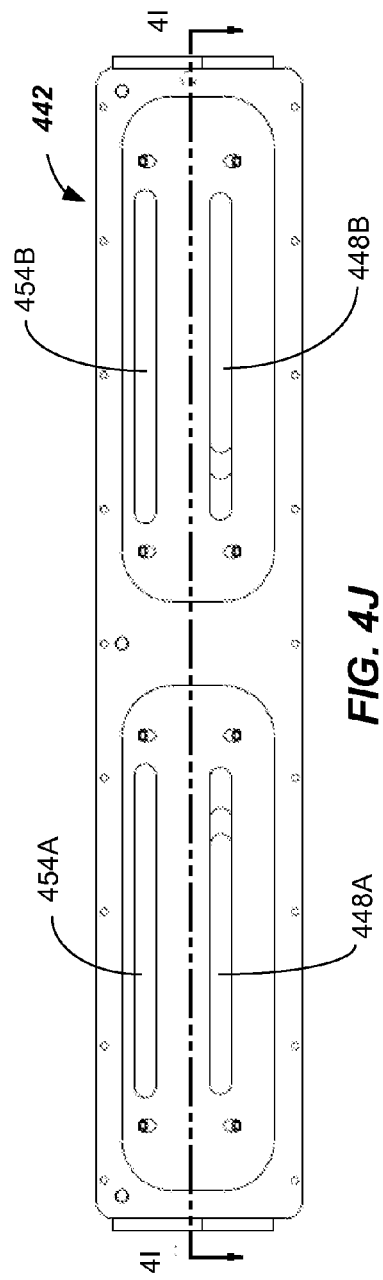

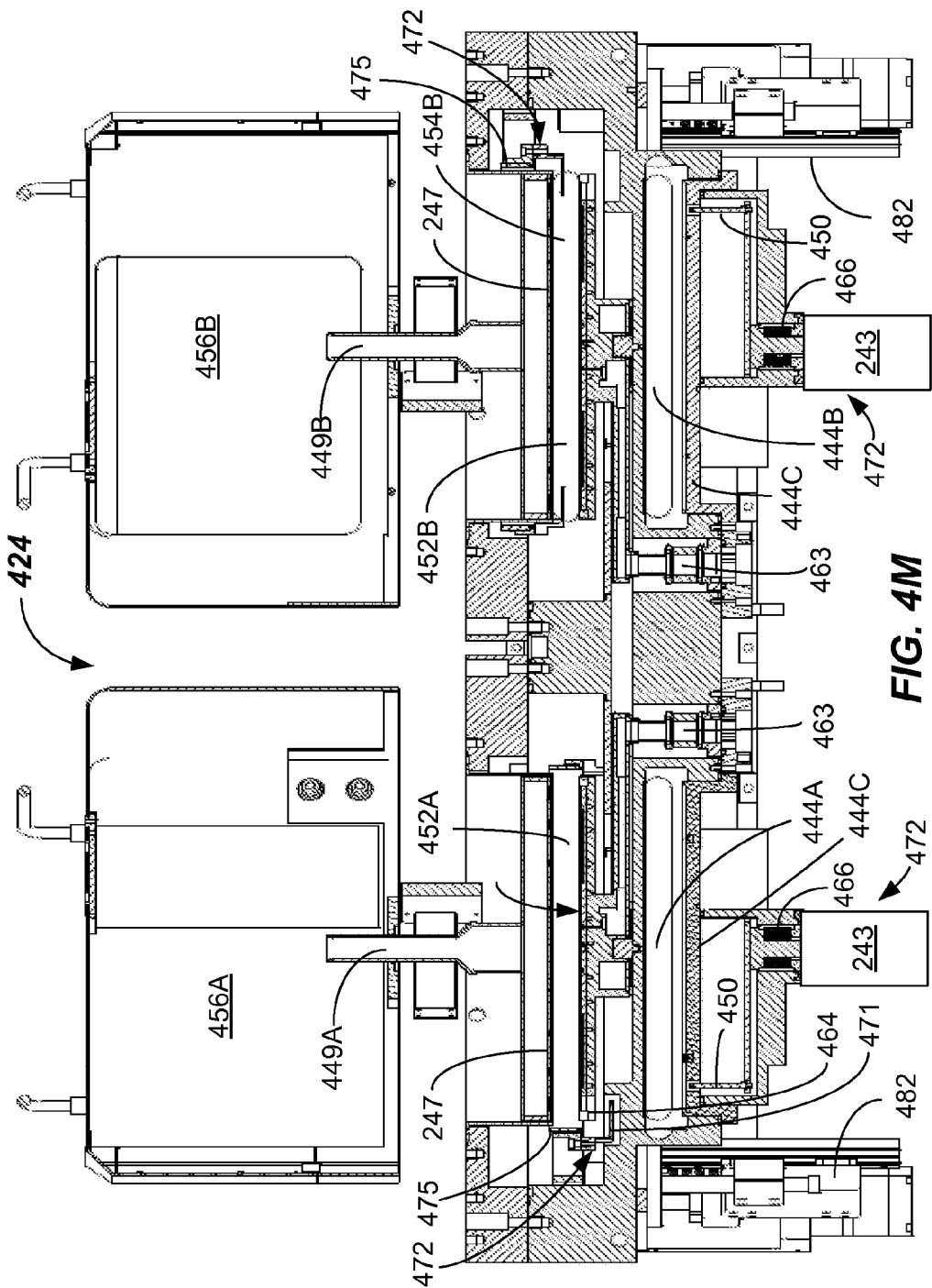

PROCESS LOAD LOCK APPARATUS, LIFT ASSEMBLIES, ELECTRONIC DEVICE PROCESSING SYSTEMS, AND METHODS OF PROCESSING SUBSTRATES IN LOAD LOCK LOCATIONS

RELATED APPLICATIONS

The present application claims priority to U.S. Provisional Application 61/786,990 filed Mar. 15, 2013, and entitled "PROCESS LOAD LOCK APPARATUS, LIFT ASSEMBLIES, ELECTRONIC DEVICE PROCESSING SYSTEMS, AND METHODS OF PROCESSING SUBSTRATES IN LOAD LOCK LOCATIONS", which is hereby incorporated herein for all purposes.

FIELD

The present invention relates generally to electronic device manufacturing, and more specifically to load lock apparatus.

BACKGROUND

Conventional electronic device manufacturing systems may include multiple process chambers and one or more load lock chambers surrounding a transfer chamber. These electronic device manufacturing systems may employ a transfer robot that may be housed within the transfer chamber, and which is adapted to transport substrates between the various process chambers and load lock chambers.

In order to add additional processes desired for certain electronic devices (e.g., substrate) manufacture, or to add additional processes within a particular tool, in other embodiments, two mainframe sections may be linked together with one or more pass-through chambers. Substrates may be passed through between the mainframe sections through the pass through chambers. The two mainframe sections may be operated at two different vacuum levels in some embodiments and different or additional processes may take place in the second mainframe section.

A factory interface, sometimes referred to as an equipment front end module, may be provided to load substrates into and out of the load lock chambers coupled to the first mainframe section. However, adding an additional mainframe section is at the expense of added complexity, and may require extra floor space, that may not always be available. Accordingly, improved apparatus, systems, and methods enabling higher throughput and ease of adding processing capacity are desired.

SUMMARY

In a first aspect, a process load lock apparatus is provided. The process load lock apparatus includes a load lock chamber adapted to be locatable between, coupled to, and accessed from a mainframe section and a factory interface, the load lock chamber including an entry and an exit each having a slit valve, and a load lock process chamber adapted to be locatable between a mainframe and a factory interface, accessed from the mainframe section, and residing at a different level than the load lock chamber wherein the load lock process chamber is adapted to carry out a process on a substrate.

According to another aspect, an electronic device processing system is provided. The electronic device processing system includes a mainframe section including a robot configured to move substrates, a factory interface having one or more load ports, and a process load lock apparatus received between the mainframe section and the factory interface, the process load lock apparatus including a load lock chamber located between and coupled to the mainframe section and the factory interface, the load lock chamber including a entrance accessible from the factory interface and an exit accessible from the mainframe section, and a load lock process chamber adapted to carry out a process on a substrate, the load lock process chamber located between the mainframe section and located at a different level than the load lock chamber.

In another aspect, a method of processing substrates is provided. The method of processing substrates includes providing a mainframe section including a robot, providing a factory interface adjacent to the mainframe section adapted to receive substrates from load ports, providing a process load lock apparatus located between the mainframe and factory interface, the process load lock apparatus including a load lock chamber coupled between the mainframe section and the factory interface at a first level, and a load lock process chamber at a second different level, and carrying out a process on a substrate in the load lock processing chamber.

In another aspect, a substrate lift assembly is provided. The substrate lift assembly includes a frame, a plurality of fingers extending from the frame, the fingers adapted to support a substrate, and a containment ring supported by the frame.

Numerous other features are provided in accordance with these and other aspects of the invention. Other features and aspects of the present invention will become more fully apparent from the following detailed description, the appended claims and the accompanying drawings.

BRIEF DESCRIPTION OF THE DRAWINGS

FIG. 4I illustrates a cross-sectioned top view of the common body of a process load lock apparatus according to embodiments.

FIG. 4J illustrates a front plan view of a common body of a process load lock apparatus viewed from the transfer chamber side according to embodiments.

FIG. 4M illustrates a cross-sectioned side view of the process load lock apparatus according to embodiments.

FIG. 4O illustrates an isometric view of a portion of a lift assembly including a frame and a containment ring according to embodiments.

DETAILED DESCRIPTION

Electronic device manufacturing may desire not only very precise and rapid transport of substrates between various locations, i.e., high throughput provided by precise and rapid motions, but may also desire additional processing capability to be added within a fixed space (e.g., floor space) envelope.

In some systems, as described above, mainframe sections have been linked together to enlarge the number of process chambers that may be available at a particular tool. For example, dual mainframe tools (sometimes referred to as "dual buffer tools") have been developed, wherein a first mainframe section and a second mainframe section are coupled together by one or more pass-through chambers. The one or more pass-through chambers are used to pass substrates back and forth between the two adjacent mainframe sections. The pass-through chambers typically have slit valves on either side to isolate the two mainframe sections, which may be operated at different vacuum levels in some cases, for example.

However, although the addition of a second mainframe section provides additional process capability, this is at the expense of system complexity and size (i.e., additional large floor footprint), which may be quite limited in some applications, especially retrofit applications. In some instances, additional process capability may be desired, yet enlarging the number of additional mainframe sections may be difficult or impossible for reasons of lack of floor space. Accordingly, substrate processing systems having increased processing capability, yet without substantially increased floor space footprint are desired.

In order to provide increased process capability in a substrate processing system without substantially increasing the floor space footprint of the substrate processing system, according to one or more embodiments of the present invention, an improved substrate processing apparatus and system is provided. The additional process capability is provided in accordance with one or more embodiments of the present invention by providing additional processing chambers at a location of the one or more load lock apparatus. Process load lock apparatus, i.e., apparatus having both load lock functionality combined with process capability at the load lock location are described and provided herein. In one or more embodiments, a load lock process chamber is provided at a different level (e.g., vertically above) the load lock chamber that is adapted to pass substrates between a factory interface to a mainframe section that houses a transfer robot and which has conventional process chambers coupled thereto.

Further details of examples of various embodiments of the invention are described with reference to FIGS. 1-5 herein.

Figure 1:
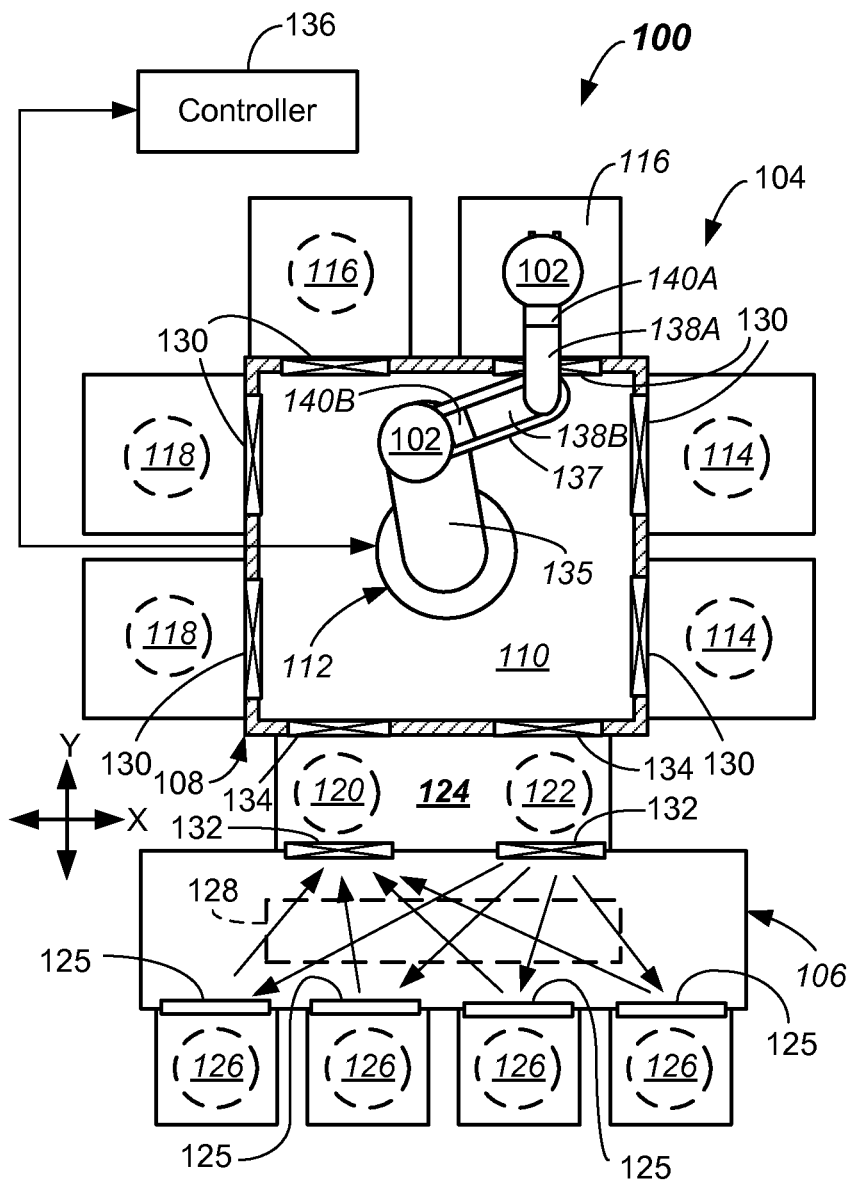
FIG. 1 illustrates a schematic top view of a substrate processing system including a process load lock apparatus wherein additional processing capability is provided at the load lock location according to embodiments.

Referring now to FIG. 1, an example of an electronic device processing system 100 according to embodiments of the present invention is disclosed. The electronic device processing system 100 is useful to carry out one or more processes on a substrate 102. The substrate 102 may be a silicon wafer, which may be an electronic device precursor such as an incomplete semiconductor wafer having a plurality of incomplete chips formed thereon. In some cases, the substrate 102 may have a mask thereon.

In the depicted embodiment, the electronic device processing system 100 includes a mainframe section 104 provided adjacent to a factory interface 106. The mainframe section 104 includes a section housing 108 and includes a transfer chamber 110 therein. The section housing 108 may include a number of vertical side walls, which may be defined by chamber facets. In the depicted embodiment, the section housing 108 includes twined chamber facets, wherein the facets on each side wall are substantially parallel or slightly misaligned relative to the facet, i.e., the entry directions into the respective twinned chambers that are coupled to the facets are substantially co-parallel. However, the line of entry into the respective chambers is not through a shoulder axis of the robot 112. The transfer chamber 110 is defined by the side walls thereof, as well as top and bottom walls and may be maintained at a vacuum, for example. The vacuum level for the transfer chamber 110 may be between about 0.01 Torr and about 80 Torr, for example.

The robot 112 is received in the transfer chamber 110 and includes multiple arms and one or more end effectors that are adapted to be operable therein. The robot 112 may be adapted to pick or place substrates 102 (e.g., the "wafers" are shown in FIG. 1 as circles) to or from a destination. The destination may be any chamber physically coupled to the transfer chamber 110. For example, the destination may be one or more first process chambers 114 coupled to the section housing 108 and accessible from the transfer chamber 110, one or more second process chambers 116 coupled to the section housing 108 and accessible from the transfer chamber 110, or one or more third process chambers 118 coupled to the section housing 108 and accessible from the transfer chamber 110. A same or different process may take place on each facet. The destination may also be one or more load lock chambers 120, 122 of a process load lock apparatus 124 in accordance with one or more embodiments of the present invention. The destinations are shown as dotted circles.

Process load lock apparatus 124 is adapted to be located between, coupled to, and accessed from the mainframe section 104 and the factory interface 106. The load lock chambers 120, 122 are coupled to the section housing 108 and factory interface 106 and are accessible from both the transfer chamber 110 and the factory interface 106. The process load lock apparatus 124 also includes one or more load lock process chambers that reside at, and are located at, a different vertical level than the load lock chambers 120, 122. Load lock process chambers are adapted to carry out a process on a substrate 102, and depending on the embodiment, may be accessible from only the transfer chamber 110, or from both the transfer chamber 110 and the factory interface, as will be apparent from the following.

The process load lock apparatus 124 will be described in more detail below and comprises a combination of processing capability and pass-through capability at the "load lock location." "Load lock location" as used herein means a location physically located between the mainframe section 104 and the factory interface 106. Process chambers 114, 116, 118 and the one or more load lock process chambers of the process load lock apparatus 124 may be adapted to carry out any number of processes on the substrates 102.

The processes carried out in process chambers 114, 116, 118 may be deposition, oxidation, nitration, etching, cleaning, lithography, or the like. Other processes may be carried out there, as well. The processes carried out in the process load lock apparatus 124 may comprise at least one selected from a deposition process, an oxide removal process, a nitration process, an etching process, and an annealing process. In one or more embodiments, the process carried out in the load lock process chamber of the load lock apparatus 124 may be an oxide removal process, such as a copper oxide removal process. In another aspect, the process may comprise a plasma-assisted process. Moreover, the process may include substrate heating, as well. These and other aspects and embodiments are detailed below.

The process load lock apparatus 124 is adapted to interface with the factory interface 106 on one side and may receive substrates 102 removed from substrate carriers 126 (e.g., Front Opening Unified Pods (FOUPs)) docked at various load ports 125 of the factory interface 106. A load/unload robot 128 (shown as dotted) may be used to transfer substrates 102 between the substrate carriers 126 and the process load lock apparatus 124, as shown by arrows. Any conventional robot type may be used for the load/unload robot 128. Transfers may be carried out in any order or direction.

As shown in FIG. 1, one or more conventional slit valves 130 may be provided at the entrance to each process chamber 114, 116, and 118. The process load lock apparatus 124 may include a first slit valve 132 on a first side adjacent to the factory interface 106, and a second slit valve 134 on a second side adjacent to the transfer chamber 110. Additional slit valves (not shown in FIG. 1) may be provided for the load lock process chambers.

Again referring to FIG. 1, the robot 112 provided in the transfer chamber 110 may include a base adapted to be attached to a wall (e.g., a floor) of the section housing 108. Robot 112 may include an upper arm 135 which, in the depicted embodiment, is a substantially rigid cantilever beam. The upper arm 135 may be adapted to be independently rotated about the shoulder axis in either a clockwise or counterclockwise rotational direction. The rotation about shoulder axis may be provided by any suitable motive member, such as upper arm drive motor that may be received in a motor housing (not shown) positioned outside of the transfer chamber 110, such as a conventional variable reluctance or permanent magnet electric motor. The rotation of the upper arm 135 may be controlled by suitable commands to the upper arm drive motor from a controller 136. In some embodiments, the motor housing and base may be made integral with one another. In other embodiments, the base may be made integral with the floor of the transfer chamber 110.

Mounted and rotationally coupled at an outboard end of the upper arm 135, at a radial position spaced from the shoulder axis, is a forearm 137. Forearm 137 may be adapted to be rotated in an X-Y plane relative to the upper arm 135 about an elbow axis at the radial position. The forearm 137 may be independently rotatable in the X-Y plane relative to the base and the upper arm 135 by a forearm drive motor (not shown), which may be provided in a motor housing (also not shown).

Located on an outboard end of the forearm 137 at a position spaced from the elbow axis may be multiple wrist members 138A, 138B. Wrist members 138A, 138B may each be adapted for independent rotation in the X-Y plane relative to the forearm 137 about a wrist axis. Furthermore, the wrist members 138A, 138B are each adapted to couple to end effectors 140A, 140B (otherwise referred to as a "blades"), wherein the end effectors 140A, 140B are each adapted to carry and transport a substrate 102 during pick and/or place operations taking place in the process chambers 114, 116, 118, load lock chambers 120, 122, and the load lock process chambers. The end effectors 140A, 140B may be of any suitable construction. The end effectors 140A, 140B may be coupled to the wrist members 138A, 138B by any suitable means such as mechanical fastening, adhering, clamping, and the like. Optionally, the respective wrist members 138A, 138B and end effectors 140A, 140B may be coupled to each other by being formed as one integral piece. Rotation of each wrist member 138A, 138B may be imparted by wrist drive motors that may located in a motor housing (not shown) that may be outside of the transfer chamber 110.

In the depicted embodiment, the end effectors 140A, 140B may be inserted into each process chamber 114, 116, 118 as well as into each load lock chamber 120, 122. Likewise, end effectors 140A, 140B may be inserted into each process chamber of the process load lock apparatus 124. This described robot is referred to as an off-axis robot because it has the capability of inserting and retracting along a line of action that is horizontally offset from the shoulder axis of the respective robot 112. Other types of robots may be used to service such off-axis or twinned process chambers and load locks 120, 122 such as the robot taught in U.S. Pat. No. 5,855,681, for example. Other robots for servicing twinned chambers may be used. Further, it should be recognized that the process load lock apparatus 124 may be used with other types of mainframe sections.

Figure 2:
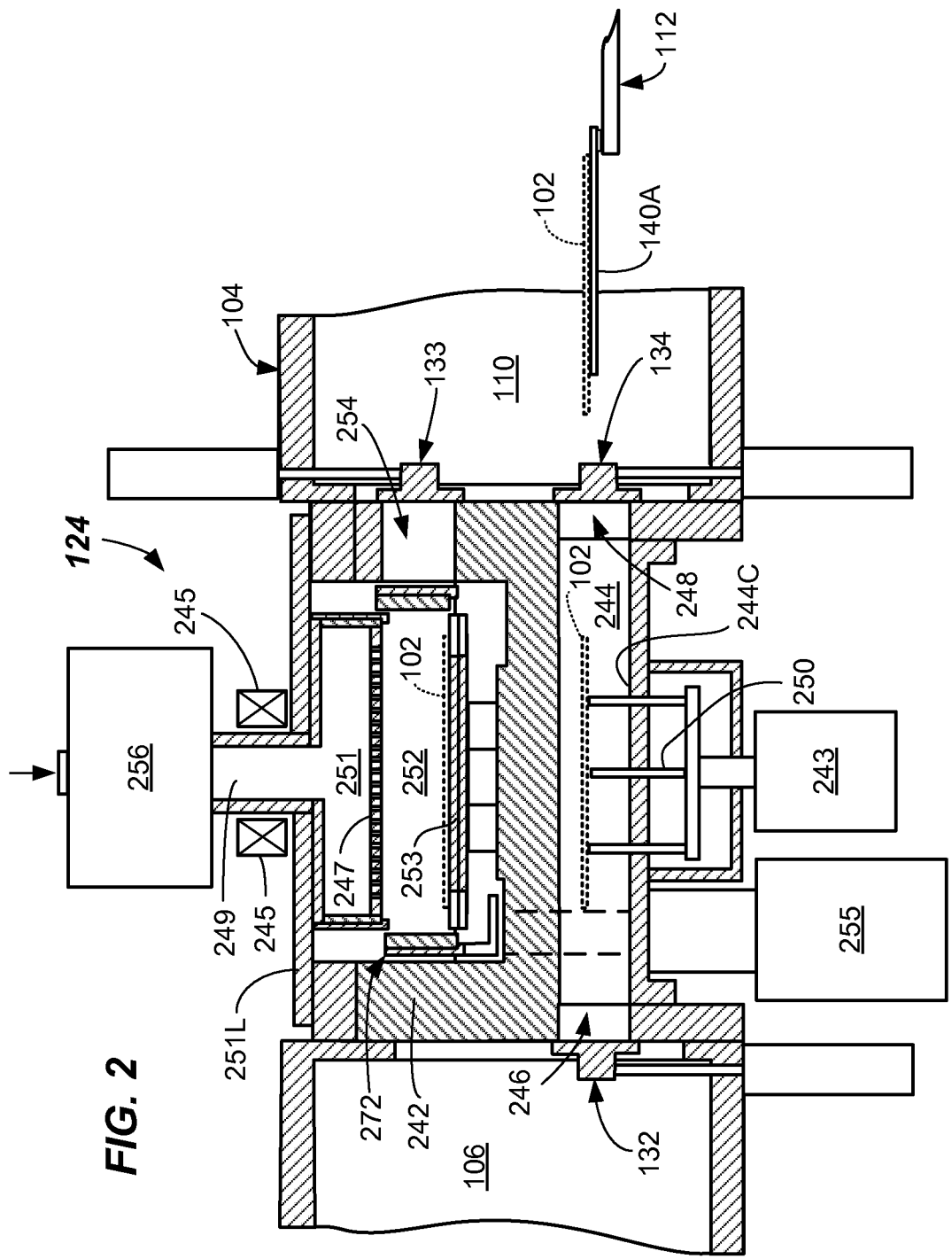
FIG. 2 illustrates a cross-sectioned side view of a process load lock apparatus according to embodiments.

FIG. 2 illustrates details of a representative process load lock apparatus 124 according to embodiments. Process load lock apparatus 124 includes a common body 242 of rigid material (e.g., aluminum) connectable to the factory interface 106 on a first side and to the section housing 108 of the mainframe section 104 on the other side, horizontally offset from the first side. Connection may be by way of a mechanical connection, such as by bolting or the like. The connection interfaces with the factory interface 106 and the section housing 108 may be sealed. The common body 242 may be one integral piece of material.

The process load lock apparatus 124 includes a load lock chamber 244 adapted to be locatable between, coupled to, and accessed from the transfer chamber 110 of the mainframe section 104 and also from the factory interface 106. Load lock chamber 244 includes an entry 246 and an exit 248, each having a respective slit valve 132, 134. Entry and exit as used herein are not conclusively indicative of direction, and the entry 246 may function as an exit in some embodiments. Likewise, the exit 248 may function as an entry in some embodiments. Accordingly, substrates 102 may pass through the load lock chamber 244 in either direction. Slit valves 132, 134 may include any suitable slit valve construction, such as taught in U.S. Pat. Nos. 6,173,938; 6,347,918; and 7,007,919. In some embodiments, the slit valves 132, 134 may be an L-motion slit valve, for example.

The load lock chamber 244 may be of conventional construction, and may include one or more supports 250 adapted to allow one or more substrates 102 (shown dotted) to be placed and supported thereon by robots 112, 128, as well as removed therefrom by robots 112, 128 (FIG. 1). Substrates 102 placed on the one or more supports 250 are accessible by each robot 112, 128 by extending the end effectors (e.g., end effectors 140A, 140B) and the end effectors of robot 128 (not shown) through the respective entry 246 and exit 248. Supports 250 may be made of any suitable construction, such as pins, pedestals, slots, platforms, or the like. In some embodiments, a lift actuator 243 may be used to lift or lower the one or more supports 250 in the load lock chamber 244. The load lock chamber 244 may include a cooling chill plate 244C, and may include a vacuum pump connected thereto.

The process load lock apparatus 124 also includes a load lock process chamber 252. Load lock process chamber 252 is located at a different vertical level than the load lock chamber 244, wherein the load lock process chamber 252 is adapted to carry out a process on a substrate 102 that is placed therein by robot 112 in the depicted embodiment. In this manner, additional processing capability for the particular tool is provided at the load lock location, and substantial additional floor space is not needed to add the additional processing capability.

In some embodiments, a remote plasma source 256 may provide plasma in a supplied gas remotely. The plasma may be provided to a pre-chamber 251 via passage 249, both of which may be a ceramic. Lid 251L of pre-chamber 251 may be removable for servicing. A showerhead 247 may separate the pre-chamber 251 and the process chamber 252 and may include many small distribution passages that function to evenly distribute the plasma to the process chamber 252. In some embodiments, the plasma may undergo an ion filtering process described in U.S. Pat. No. 7,658,802 to Fu et al. by providing one or more magnets 245 that act on the plasma in the passage 249.

Z-axis capability may be provided on the robot 112 in order to service the load lock chamber 244, the process chambers 114, 116, 118, and the load lock process chamber 252. Vertical Z-axis capability of up to about 200 mm may be provided by the robot 112, and in some embodiments, a center-to-center vertical spacing between the load lock chamber 244 and the load lock process chamber 252 may be about 90 mm. Other dimension may be used. Process chambers 114, 116, 118 may be located at a same vertical level as the load lock chamber 244 or at a level in between the level of the load lock chamber 244 and the level of the load lock process chamber 252, for example. Other chamber location options may be used.

In the depicted embodiment, the load lock process chamber 252 is arranged and positioned vertically above the load lock chamber 244. In the depicted embodiment, the entryway is through an opening 254 communicating with the transfer chamber 110 of the mainframe section 104. In the depicted embodiment, a slit valve 133 may seal the opening 254 of the load lock process chamber 252. The slit valve 133 may be provided and may be of the type of slit valve discussed above. The load lock process chamber 252 may have a single opening 254 that is only accessible from the transfer chamber 110 in some embodiments.

Figure 3:
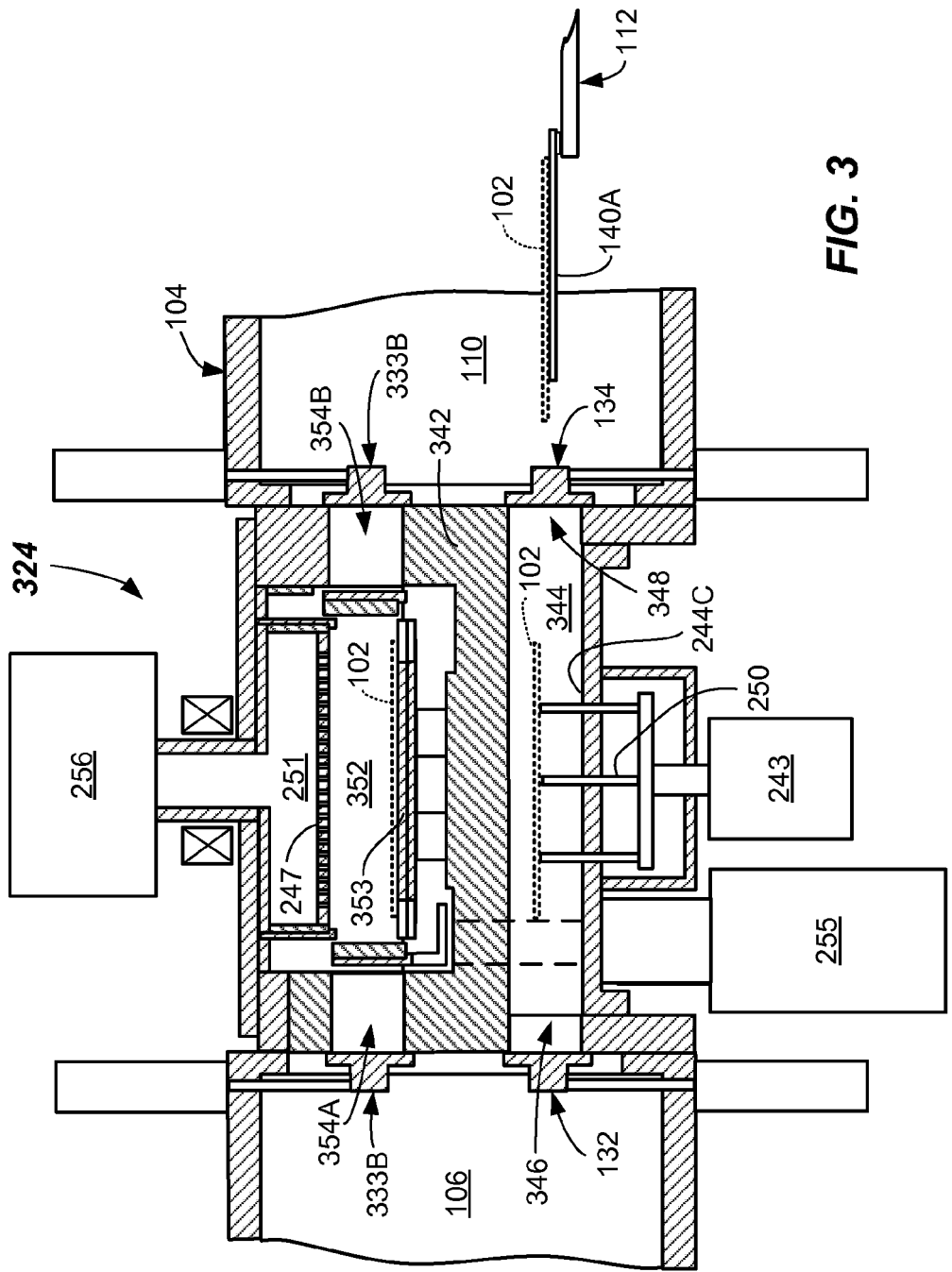
FIG. 3 illustrates a cross-sectioned side view of another process load lock apparatus according to embodiments.

The embodiment of FIG. 3 provides an alternative embodiment of a process load lock apparatus 324 having a load lock chamber 344 and a load lock process chamber 352 located and positioned directly vertically above the load lock chamber 344, but where multiple openings 354A, 354B are provided into the common body 342 of the load lock process chamber 352. Slit valves 133A, 133B may be provided at each opening 354A, 354B. Thus, entry and exits 346, 348, as well as openings 354A and 354B may be used to transfer substrates 102 through between the transfer chamber 110 and the factory interface 106. Thus, pass-through capability is provided through the load lock process chamber 352 in the depicted embodiment. The load lock process chamber 352 has a first opening 354A adapted to couple to and be accessible from the factory interface 106, and a second opening 354B adapted to couple to and be accessible from the transfer chamber 110 of the mainframe section 104. Slit vales 333A, 333B may be provided at the first and second openings 354A, 354B.

Now referring to both FIGS. 2 and 3, the load lock process chambers 252, 352 may each include a pedestal 253, 353 upon which a substrate 102 to be processed may rest. The pedestal 253, 353 may be a stationary pedestal and may be heated in some embodiments, such as by a resistive heater formed therein (such as shown in FIGS. 4D and 4E). The load lock process chambers 252, 352 may carry out a process on the substrate 102. In particular, the process carried out in the load lock process chambers 252, 352 may be at least one selected from a group of processes consisting of a deposition process, an oxidation process, a nitration process, an annealing process, an etching process, and a cleaning process. In other embodiments, the process carried out in the load lock process chambers 252, 352 may be an oxide removal process (e.g., a copper oxide removal process), or a halogen abatement process. In some embodiments, the process carried out is a plasma-assisted process.

For example, an abatement process for removal of halogen-containing residues may take place in the load lock process chambers 252, 352. For example, abatement may be carried out to remove one or more of hydrogen bromide (HBr), chlorine ($Cl_2$), or carbon tetrafluoride ($CF_4$) from the substrate 102. A suitable abatement process for removal of halogen-containing residues is taught in U.S. Pat. No. 8,293,016, for example, and may be carried out within the load lock process chambers 252, 352 according to some embodiments.

The pressure level in the load lock process chambers 252, 352 may be controlled, and in some instances evacuated by a coupled vacuum pump 255 (e.g., a turbo pump) to a suitable vacuum range suitable for carrying out the desired process. For example, the a base vacuum level may be maintained at a pressure of below about $1 \times 10^{-2}$ mTorr, whereas processing pressure may be maintained in the range of about sub 10 mTorr to about sub Torr level. Other vacuum pressures may be used. Thus, it should be recognized that the vacuum pump 255 may be connected to the load lock process chamber 252, 352. A separate vacuum pump (not shown) may be pneumatically coupled to the load lock chambers 244, 344 and may produce a vacuum therein. In some embodiments, the vacuum pump for the load lock chamber 244, 344 may be the same as the vacuum pump for the process load lock chamber 252, 352.

Additionally, one or more gases may be supplied to the load lock process chambers 252, 352 to carry out the desired process. Inert gasses, process gasses, or cleaning gases may be introduced. For example, inert gases such as nitrogen ($N_2$), argon (Ar), or helium (He) may be introduced. Inert gases may be used as carrier gases in some embodiments. Similarly, cleaning or process gases such as Hydrogen ($H_2$), Ammonia ($NH_3$), Oxygen ($O_2$), ozone ($O_3$), and the like may be supplied to the load lock process chambers 252, 352. Combinations of inert gases and cleaning or process gases may be supplied.

In another embodiment, a copper oxide removal process may take place in the load lock process chambers 252, 352. A suitable copper oxide removal process is described in U.S. Pat. No. 6,656,840 to Rajagapalan et al. In some processes, a plasma source 256, such as the remote plasma source shown, may be provided and coupled to the load lock process chambers 252, 352, as will be explained further below. The other components of the FIG. 3 embodiment are the same as described in FIG. 2.

Again referring to FIG. 1, electronic device processing system 100 may include more than one process load lock, such as one above each of the load lock chambers 120, 122. In particular, the electronic device processing system 100 may comprise the first and second load lock processing chambers (e.g., see 452A, 452B of FIG. 4I-4M) above the load lock chambers 120, 122, and arranged in a side-by-side arrangement. The two load lock processing chambers (e.g., 452A, 452B) may be identical to that disclosed in FIG. 2 or FIG. 3, and may be substantially identical mirror images of one another, as will be apparent from the following.

Figure 4A:
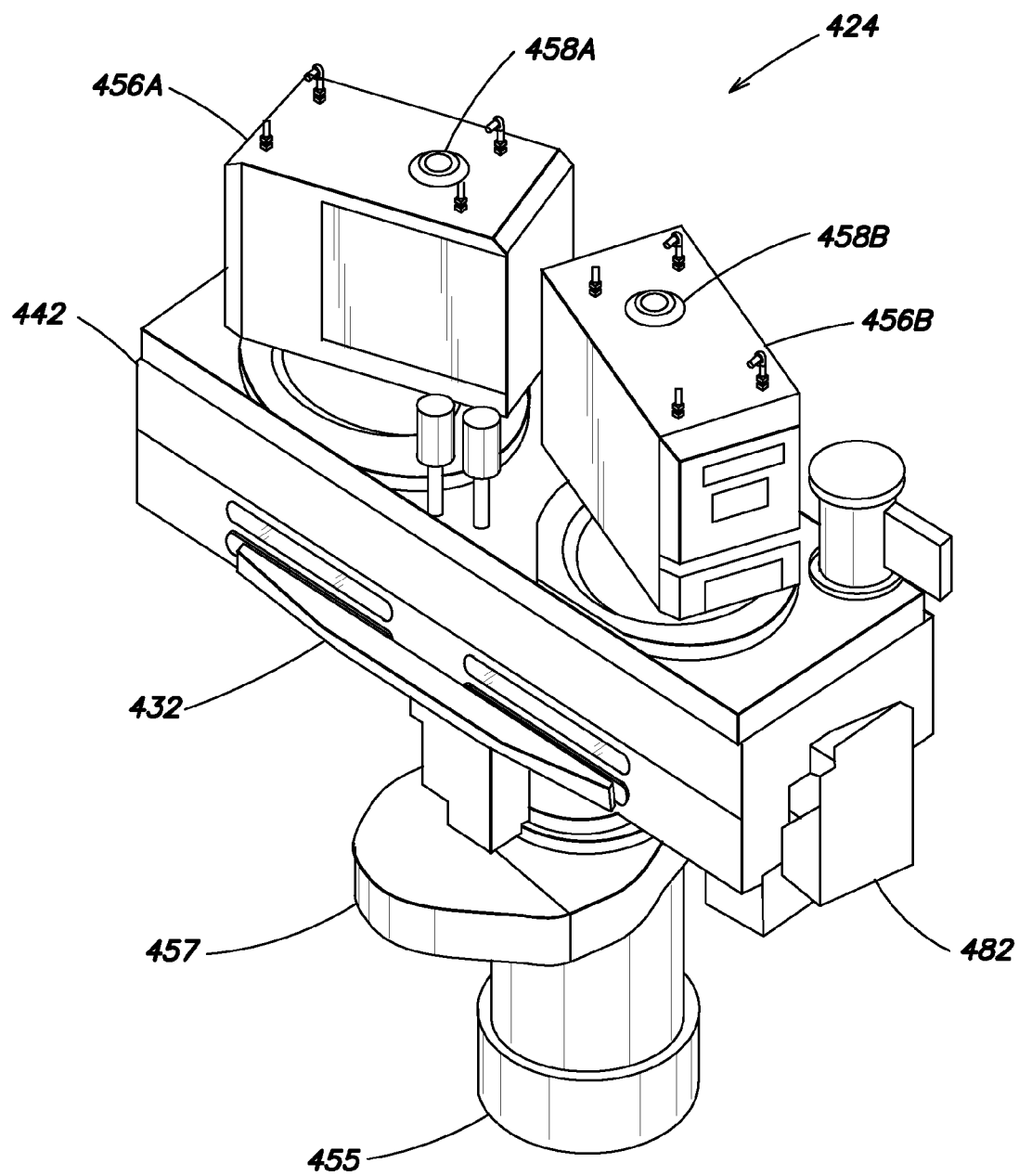
FIG. 4A illustrates an isometric view of a process load lock apparatus according to embodiments.
Figure 4B:
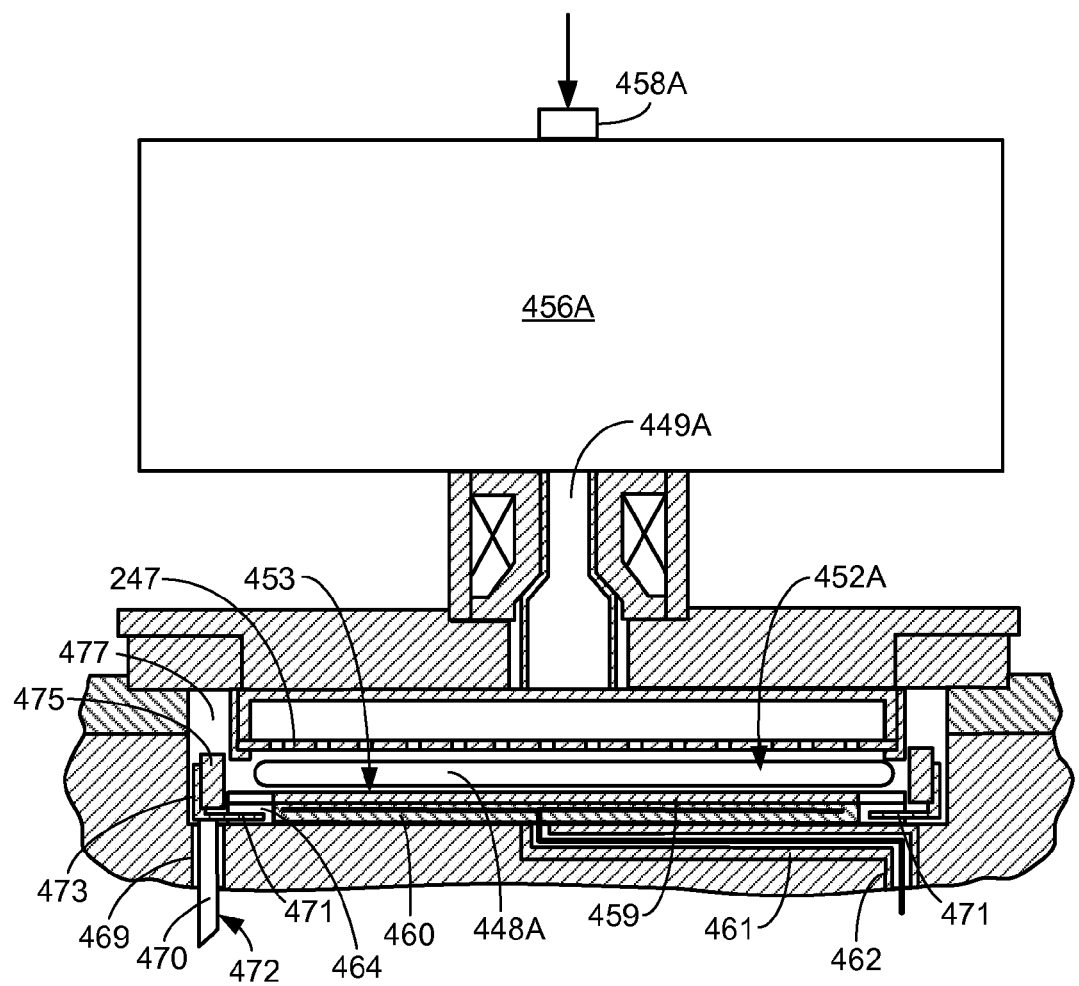
FIG. 4B illustrates a cross-sectioned side view of a single processing chamber and components of a process load lock apparatus according to embodiments.
Figure 4C:
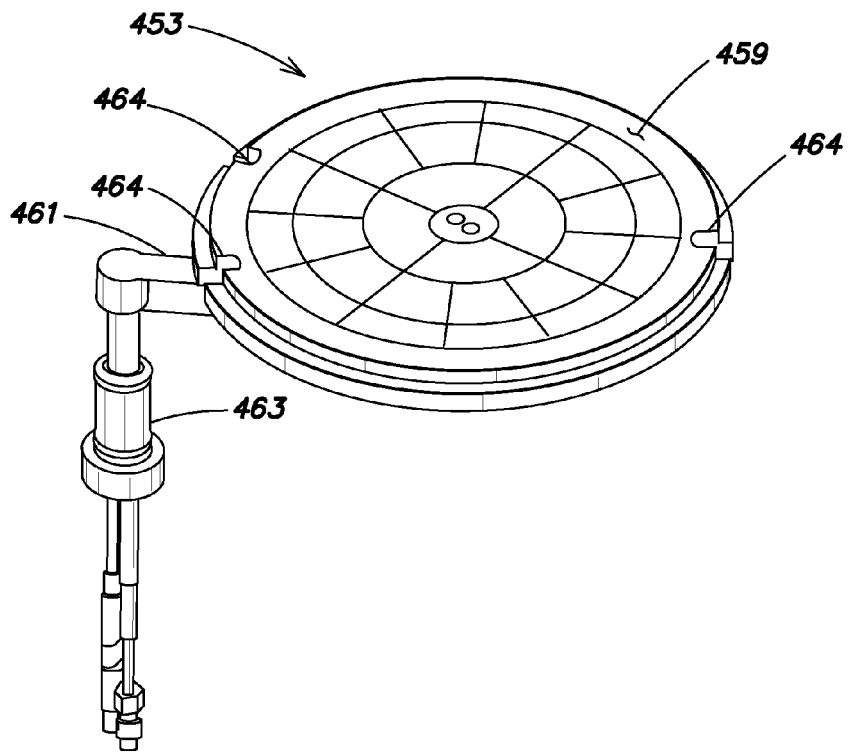
FIGS. 4C and 4D illustrate isometric and cross-sectioned isometric views, respectively, of a heated pedestal of a process load lock apparatus according to embodiments.
Figure 4D:
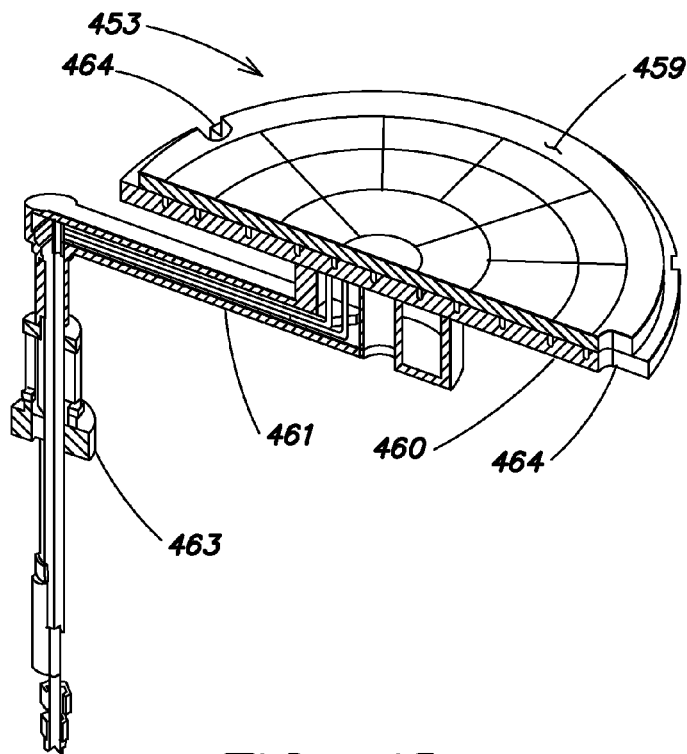
Figure 4E:
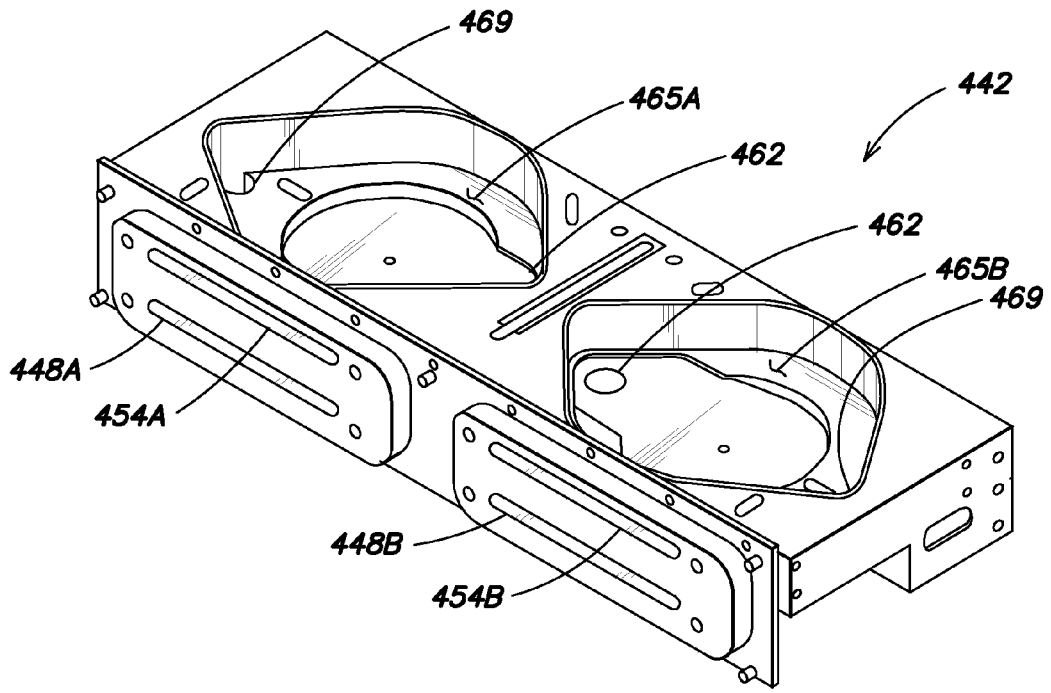
FIGS. 4E and 4F illustrate isometric and partial isometric views, respectively, of a common body of a process load lock apparatus according to embodiments.
Figure 4F:
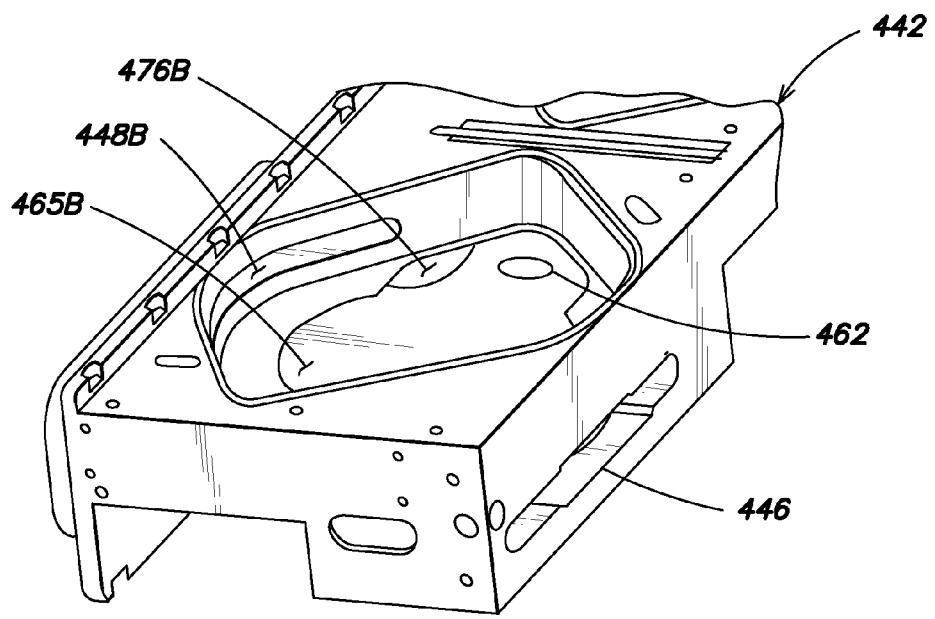
Figure 4G:
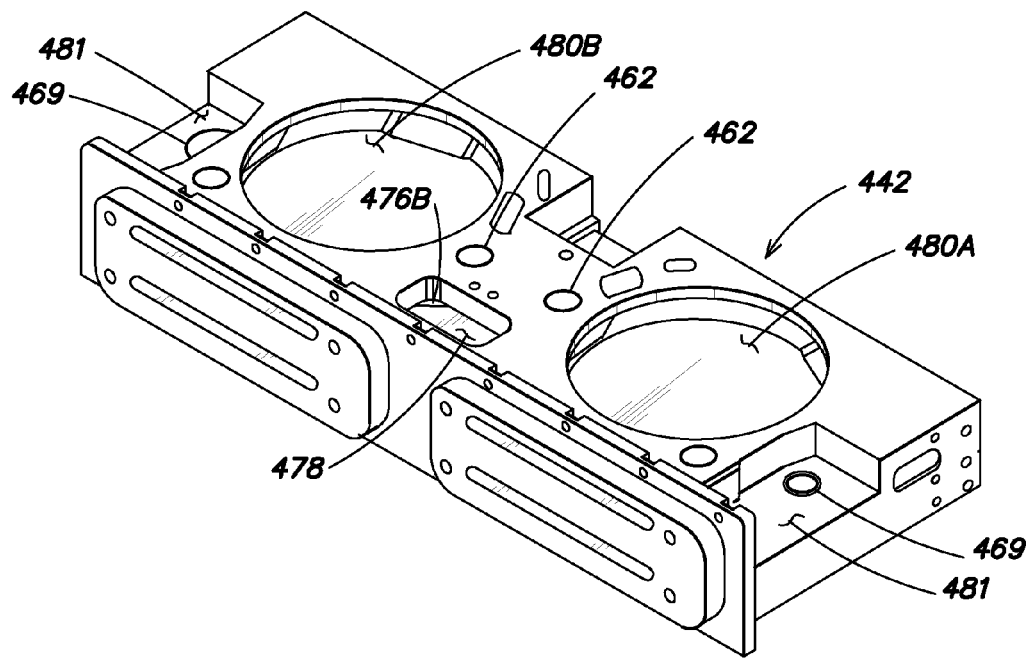
FIG. 4G illustrates isometric view of an underside of a common body of a process load lock apparatus according to embodiments.
Figure 4H:
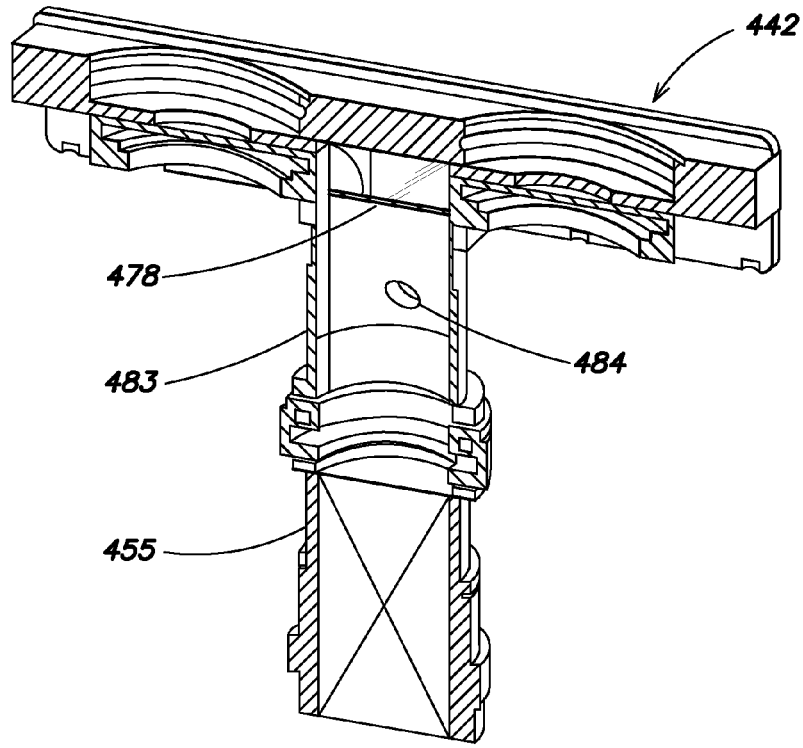
FIG. 4H illustrates a cross-sectioned isometric view of the common body and connection to a vacuum pump of a load process lock apparatus according to embodiments.
Figure 4K:
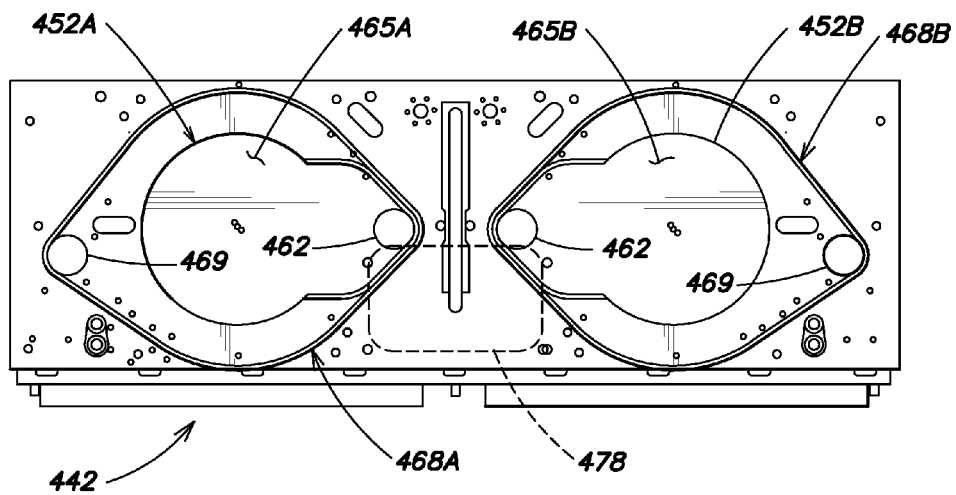
FIG. 4K illustrates a top plan view of the common body of a process load lock apparatus according to embodiments.
Figure 4L:
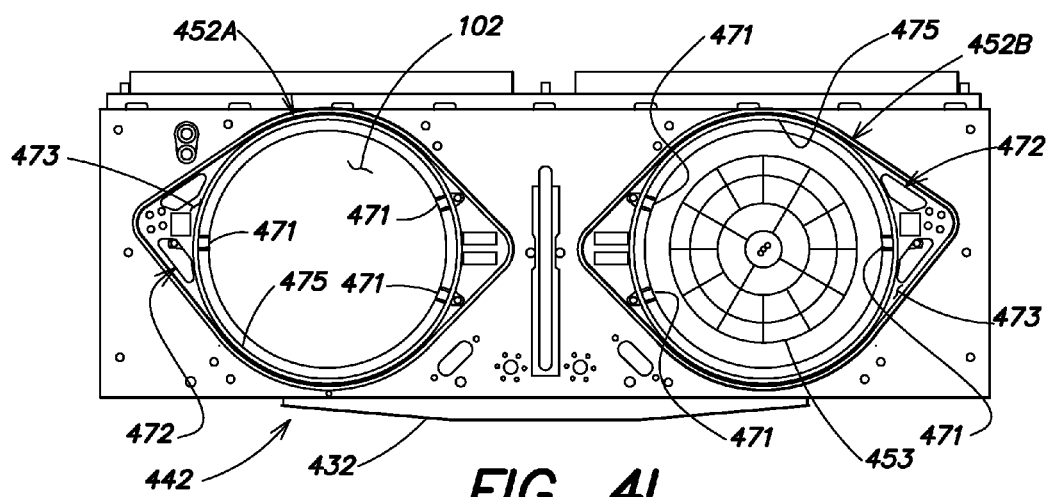
FIG. 4L illustrates a top plan view of the common body of a process load lock apparatus with the pedestals and lift assemblies installed, and with the lids and remote plasma sources removed, according to embodiments.
Figure 4N:
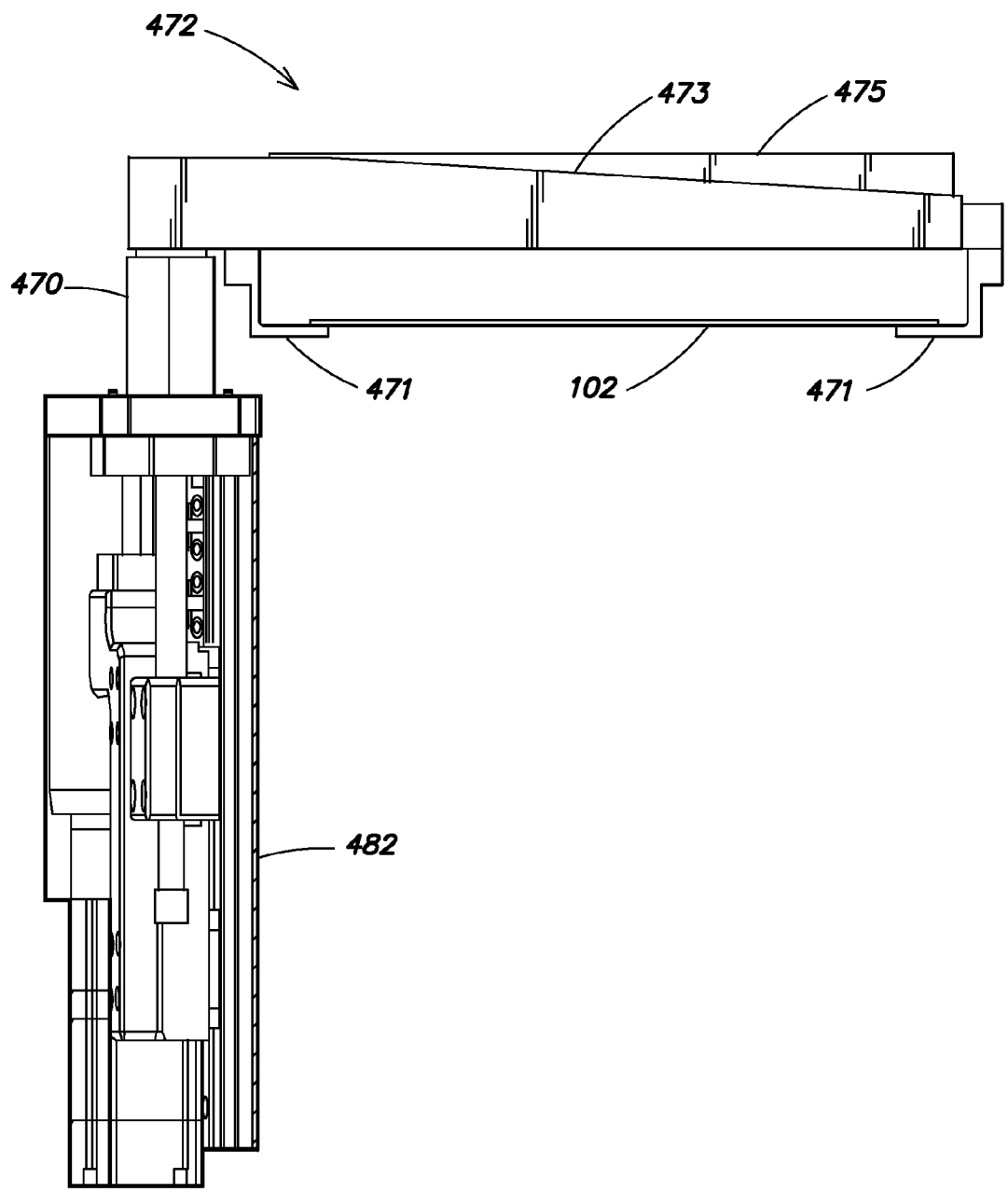
FIG. 4N illustrates a side view of a lift assembly according to embodiments.
Figure 40:
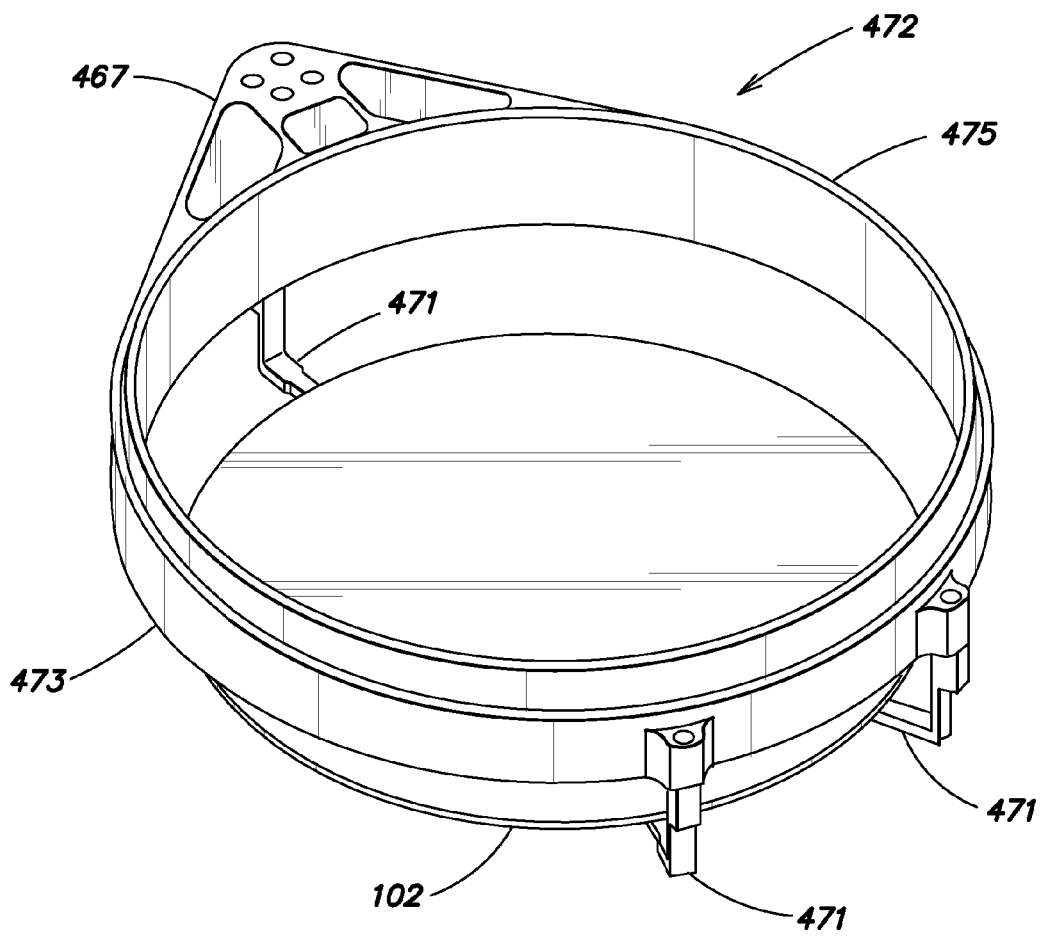
Figure 4P:
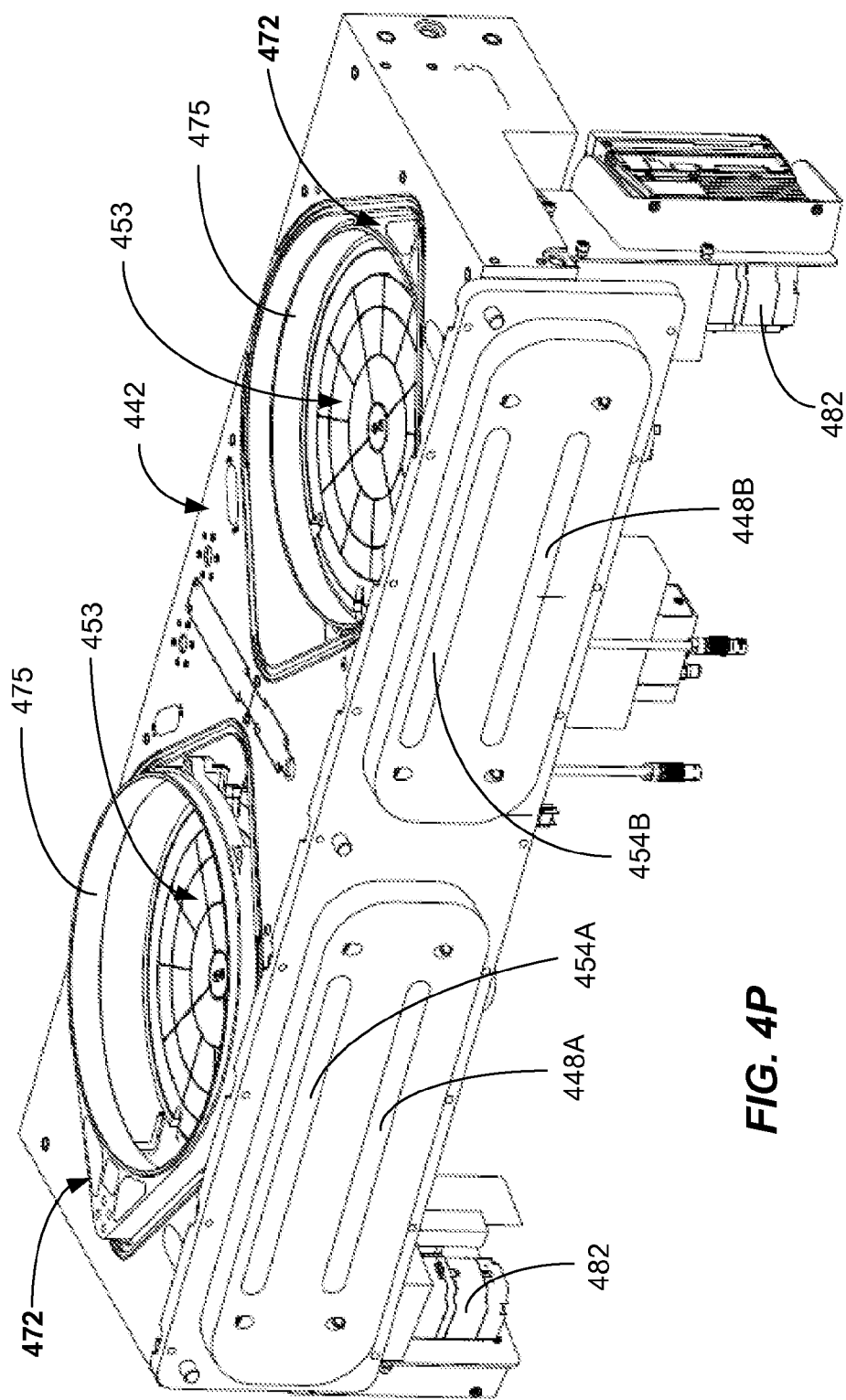
FIG. 4P illustrates an isometric view of the process load lock apparatus, with the lids and remote plasma sources removed, according to embodiments.

FIGS. 4A-4P illustrates isometric and other views of another embodiment of the process load lock apparatus 424. Process load lock apparatus 424 includes a common body 442 having slit valve assembly 432 operable with load lock chambers 444A, 444B of the factory interface side, and a separate slit valve (not shown) operable with the load lock process chambers 452A, 452B, which are accessible from the transfer chamber 110. Exits from the load lock chambers 444A, 444B may be provided on the other side and coupled to transfer chamber 110. As discussed above, the load lock process chambers 452A, 452B may be located directly above the load lock chambers 444A, 444B. As shown in FIGS. 4A, 4B and 4M, plasma sources 456A, 456B may be coupled to each of the process chambers 452A, 452B. In the depicted embodiments, a gas (e.g., $H_2$) may be supplied at an inlet 458A, 458B to the remote plasma sources 456A, 456B. Distribution channel 449A, 449B couple the respective load lock process chambers 452A, 452B to the remote plasma sources 456A, 456B.

A suitable vacuum pump 455 and control valve 457 (FIG. 4A) may be provided underneath the common body 442 and may be used to generate a suitable vacuum within the various process chambers 452A, 452B for the particular process being carried out therein. Control valve 457 may be a VAT651 or the like. Vacuum pump may be a BOC Edwards ISO-200 Turbo pump or the like. Other control valves and vacuum pumps may be used. Vacuum levels as described above may be provided. As shown in FIG. 4A, the slit valve assembly 432 is wide enough to seal both the first load lock chamber 444A and the second load lock chamber 444B simultaneously. In the FIG. 4A embodiment, the slit valve assembly 432 is shown in an open position. Similar slit valves are provided on the transfer chamber side 110 for the exits of the load lock chambers 444A, 444B and process chambers 452A, 452B.

Referring now to FIGS. 4C and 4D, a pedestal 453 is shown in detail. The pedestal 453 may include a top plate 459, which may be an aluminum material adapted to contact the substrate 102. The pedestal 453 may include a support 460 underneath the top plate 459 (which may also be aluminum) and which may include an internal resistive heater having resistive elements laid out in grooves in the support element 460. The resistive heater may heat the substrate 102 to a suitable processing temperature, such as between about 0 degrees C. and about 300 degrees C., or more. The power input cables to the resistive heater may extend horizontally in a channel 461 and then may extend vertically downward through a heater port 462 (FIGS. 4E, 4F, 4G, 4I, and 4K) formed in the common body 442. Heater port 462 is offset from the center of the top plate 459. A suitable sealed pass through 463 may hermetically seal with the heater ports 462. Shown in the top plate 459 are multiple finger recesses 464 that are configured and adapted to receive fingers 471 (e.g., three or more fingers) below the surface thereof. The fingers 471 of a lift assembly 472 (FIGS. 4N and 4O) are adapted to contact and lift the substrate 102 during substrate exchange with the robot 112. The fingers 471 may number three or more, for example. Fingers 471 may extend from a connecting portion, such as a lift frame 473 that is connected to the riser portion 470 by connection flange 467.

FIG. 4E illustrates the common body 442 showing the multiple cutouts 465A, 465B for forming the side-by-side load lock process chambers 452A, 452B (FIGS. 4K, 4L, and 4M). The common body 442 includes process chamber slots 454A, 454B located directly above load lock slots 448A, 448B. Slots 454A, 454B and 448A, 448B receive substrates 102 when loading and unloading. On a side of the cutouts adjacent to the ends of the common body 442, lift passages 469 (see also FIG. 4G) are formed for accepting the riser portion 470 of the lift assembly 472 as described herein. The common body 442 includes cutout portions 465A, 465B forming portions of the load lock process chambers 452A, 452B that are arranged above the load lock chambers 444A, 444B, and the chamber top of the load lock chambers 444A, 444B and the chamber bottom of the load lock process chamber 452A, 452B are formed in the common body 442.

FIG. 4F illustrates a partial isometric view of the common body 442 including a slot exit 446 leading to and from the load lock chamber 444B from the factory interface side. Also shown is a chamber port 476B, which connects to a pump port 478, which may be a rectangular shaped port on the underside of the common body 442, as shown in FIGS. 4G and 4H.

FIG. 4G illustrates cutouts 480A, 480B forming parts of the load lock chambers 444A, 444B in the common body 442. Pump port 478 connects to the chamber ports (e.g., 476A, 476B) of each of the process chamber 452A, 452B. Chamber port 478 is adapted to couple to the vacuum pump 455 (FIG. 4H). Heater ports 462 carry the electrical cables of the heater formed in the support 460. Lift passages 469 on respective ends of the common body 442 receive riser portions 470 of the lift assembly 472. Body recesses 481 provide surfaces adapted for mounting of the lift actuators 482 (FIGS. 4M and 4O). Lift actuators 482 function to lift the riser portion 470, which is interconnected to the fingers 471 thereby facilitating lifting of the substrate 102 during processing.

FIG. 4H illustrates the connection of the vacuum pump 455 to the common body 442 by an adapter 483 that transitions from the rectangular shape of the pump port 478 to the round shape of the pump 455. Also provided in the adapter 483 may be a high vacuum port 484 that is adapted to couple to a high vacuum pump (not shown) via conduits for processing requiring higher vacuum levels. Within the common body 442, the pump port 478 interconnects internally to each of the load lock process chambers 452A, 452B.

FIGS. 4I and 4J illustrate the common body 442 into which the process chambers 452A, 452B reside. FIG. 4I is a cross-sectioned view taken along section line 41-41 of FIG. 4J of the common body 442 and illustrates the interconnection and break out of the pump port 478 to the lower plenums of the chambers 452A, 452B.

FIG. 4K illustrates a top view of the common body 442 into which the process chambers 452A, 452B reside. The cutouts 465A, 465B housing the chambers 452A, 452B have an elongated shape connecting to the heater port 462 and the lift passages 469. Undercut regions 468A, 468B of the cutouts 465A, 465B break out into the pump port 478 and provide internal interconnection passages for evacuation.

FIGS. 4L, 4N, 4O and 4P illustrates the lift assembly 472 in various views in accordance with another broad aspect of the invention capable of independent use. Lift assembly 472 includes a lift frame 473, which may be a hoop-shaped frame of an aluminum material. The fingers 471 are coupled to the frame 473 and may be attached by suitable fasteners, such as screws or bolts, or made integral with the frame 473. The fingers 471 support the substrate 102 (as shown in the left chamber 452A) and when the lift actuator 482 is actuated to an upper position by the riser portion 470, this positions the substrate 102 to allow the end effector 140A of the robot 112 to extract the substrate 102 from the process chamber 452A. Identical lift assemblies 472 operate with each process chamber 452A, 452B.

Mounted within the frame 473 is a containment ring 475, which may be a quartz or alumina ring. The containment ring 475 may function to reduce the impact of the geometry of the process chamber slots 454A, 454B on the plasma process taking place within the load lock process chambers 452A, 452B, thus providing improved uniformity. The containment ring 475 extends between the pedestal 453 and the showerhead 247 and fills the vertical gap there between. A radial gap of about 3 mm may be provided between the periphery of the pedestal 453 and an inner diameter of the containment ring 475. Other gaps may be used. Containment ring 475 may be annular in shape, and may rest in a pocket formed in the frame 473.

As can be seen in FIG. 4B, the containment ring 475 substantially surrounds the load lock process chamber 452A when the plasma-assisted process is taking place in the load lock process chamber 452A. An identical containment ring 475 may be provided in load lock process chamber 452B. When the frame 473 is lifted via the action of the riser portion 470 via being actuated by lift actuator 482, the containment ring 475 moves and is received in annular shaped upper pocket 477 (FIG. 4B) radially outward from the showerhead 247. Accordingly, the ring 475 comprises a moveable containment ring.

FIG. 4M illustrates a representative cross-section of the load lock apparatus 424 illustrating the process chambers 452A, 452B, the load lock chambers 444A, 444B, and other components. On load lock process chamber 452B, the lift assembly 472 is shown positioned in the upper position for exchange. Note that the containment ring 475 is lifted above the process chamber slot 454B so as not to impede substrate exchange in the load lock process chamber 452B. The left load lock process chamber 452A illustrates the lift assembly 472 in the lower position with the fingers 471 received through the finger recesses 464. Lower lift assemblies 472 are also shown including bellows 466, lower lift actuators 243, supports 450, and cool down platforms 444C. FIG. 4P illustrates another representative view of the lift assembly 472 and other components.

Figure 5:
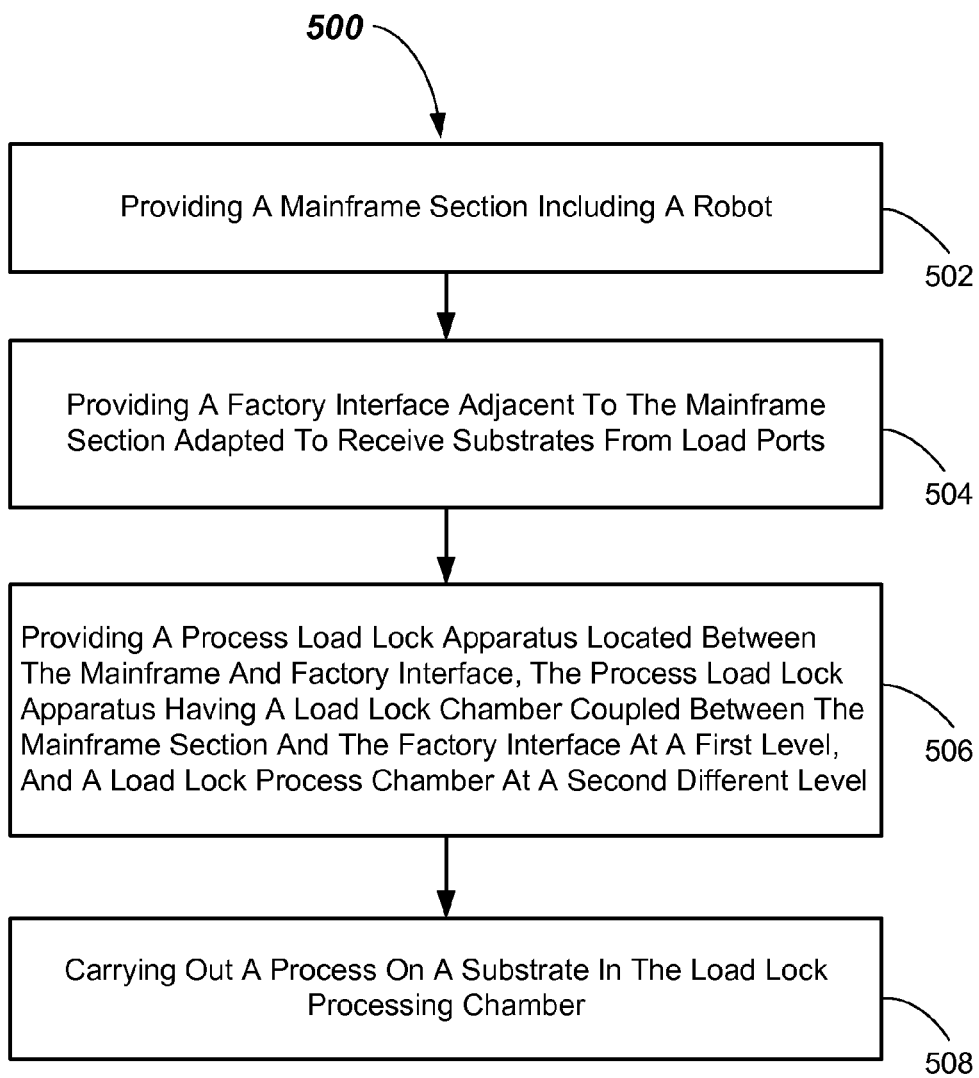
FIG. 5 illustrates a flowchart depicting a method of processing substrates in a process load lock apparatus according to embodiments.

As shown in FIG. 5, a method 500 of processing substrates (e.g., substrates 102) is provided. The method 500 includes, in 502, providing a mainframe section (e.g., mainframe section 104) including a robot (e.g., 112), and, in 504, providing a factory interface (e.g., factory interface 106) adjacent to the mainframe section (e.g., mainframe section 104) adapted to receive substrates (e.g., substrates 102) from load ports (e.g., from substrate carriers 126 docked at load ports 125). The method 500 further includes, in 506, providing a process load lock apparatus (e.g., process load lock apparatus 124, 324, or 424) located between the mainframe (e.g., mainframe section 104) and the factory interface (factory interface 106), the process load lock apparatus (e.g., process load lock apparatus 124, 324, or 424) having a load lock chamber (e.g., load lock chamber 120, 122, 244, 344, 444A, or 444B) coupled between the mainframe section (e.g., mainframe section 104) and the factory interface (e.g., factory interface 106), at a first level (e.g., a lower level), and a load lock process chamber (e.g., 252, 352, 452A, or 452B) at a second different level (e.g., a level above the load lock chamber 120, 122, 244, 344, 444A, or 444B).

In 508, the method 500 includes carrying out a process on a substrate (e.g., substrate 102) in the load lock process chamber (e.g., 252, 3352, 452A, or 452B). The process carried out may be a plasma-assisted process, wherein RF pulses having a power of less than about 1,000 W are provided. For example, the process may be an oxide removal process, such as a copper oxide removal process. In some embodiments, the process carried out may be a deposition process, an oxidation process, a nitration process, an etching process, or an annealing process. In other embodiments, the process may be a pre-cleaning process including hydrogen radicals passing through a showerhead (e.g., showerhead 247). In other embodiments, the process may be a plasma-assisted abatement process.

In accordance with an operational embodiment of the invention, a substrate 102 may be transferred from a substrate carrier 126 docked at a load port 125 of the factory interface 106 by load/unload robot 128. The substrate 102 may be placed in the load lock chamber (e.g., 120, 122, 244, 344, or 444A, 444B), the slit valve 132 closed, and the load lock chamber may be drawn down to the appropriate vacuum level of the transfer chamber 110 with a conventional vacuum pump not shown. The slit valve 134 may then be opened and the end effector 140A of the robot 112 (only a portion shown) may then extract the substrate 102 from the load lock chamber (e.g., 120, 122, 244, 344, or 444A, 444B), and raise the end effector 140A up to the level of the load lock process chamber (e.g., 252, 352, 452A, 452B) where the substrate 102 is inserted on the lift assembly (e.g., 272, 472) and then lowered onto the pedestal (e.g., 253, 353, 453). This also brings the containment ring into alignment between the showerhead 247 and the pedestal (e.g., 253, 353, 453). The slit valve 133 may then close, and a suitable vacuum for the process may be applied via vacuum pump 255, 455 through common pump port 478 formed in the common body (e.g., 242,342, 442). After the substrate 102 is heated via the pedestal 253,353, 453 to an appropriate temperature level for the particular process, the substrate 102 may undergo a plasma-assisted process wherein the plasma may be contained by the containment ring (e.g., 475). Following this, slit valve 133 may be opened and the substrate 102 may be removed from the process chamber (e.g., 252, 352, 452A, 452B) and may be transferred by robot 112 to undergo one or more additional processes at one or more of the other process chambers 114, 116, 118. In some embodiments, the process at one or more of the process chambers (e.g., 114, 116, 118) may take place first with subsequent transfer and processing at the process chamber (e.g., 252, 352, 452A, 452B) thereafter.

The foregoing description discloses only exemplary embodiments of the invention. Modifications of the above-disclosed systems, apparatus and methods which fall within the scope of the invention will be readily apparent to those of ordinary skill in the art. Accordingly, while the present invention has been disclosed in connection with exemplary embodiments thereof, it should be understood that other embodiments may fall within the scope of the invention, as defined by the following claims.

The invention claimed is:
1. An electronic device processing system, comprising:
a mainframe section including a robot configured to move substrates;
a factory interface having one or more load ports adapted to receive substrate carriers thereat; and
a process load lock apparatus received between the mainframe section and the factory interface, the process load lock apparatus including
a load lock chamber located between and coupled to the mainframe section and the factory interface, the load lock chamber including an entrance accessible from the factory interface and an exit accessible from the mainframe section, and a load lock process chamber adapted to carry out a process on a substrate, the load lock process chamber coupled to the mainframe section and located at a different level than the load lock chamber the load lock process chamber further includes a lift assembly including a containment ring, and horizontally extending fingers configured to support a substrate underneath the containment ring, wherein the containment ring and the horizontally extending fingers are configured to move as a unit upon actuation by a lift actuator.

2. A process load lock apparatus, comprising:

a load lock chamber adapted to be locatable between, coupled to, and accessed from a mainframe section and a factory interface, the load lock chamber including an entry and an exit each having a slit valve, and a load lock process chamber adapted to be locatable between a section housing of the mainframe section and the factory interface, accessed from the mainframe section, and residing at a different level than the load lock chamber wherein the load lock process chamber is adapted to carry out a process on a substrate, the load lock process chamber further including:

a lift assembly including a containment ring, and horizontally extending fingers configured to support a substrate underneath the containment ring, wherein the containment ring and the horizontally extending fingers are configured to move as a unit upon actuation by a lift actuator.

3. The process load lock apparatus of claim 2, wherein the process comprises at least one process selected from a deposition process, an oxide removal process, a nitration process, an etching process, a plasma-assisted process, and an annealing process.

4. The process load lock apparatus of claim 2, comprising the load lock process chamber arranged above the load lock chamber.

5. The process load lock apparatus of claim 2, comprising the load lock process chamber arranged above the load lock chamber, and a chamber top of the load lock chamber and a chamber bottom of the load lock process chamber are formed in a common body.

6. The process load lock apparatus of claim 2, wherein the load lock process chamber comprises a single opening adapted to couple to, and allow access from, a transfer chamber of the mainframe section.

7. The process load lock apparatus of claim 2, comprising a remote plasma source coupled to the load lock process chamber.

8. The process load lock apparatus of claim 2, comprising:
the load lock chamber and a second load lock chamber arranged in a side-by-side orientation;
the load lock process chamber and a second load lock process chamber arranged in a side-by-side orientation, each of the load lock process chamber and the second load lock process chamber being located above respective ones of the load lock chamber and the second load lock chamber.

9. The process load lock apparatus of claim 8, comprising a remote plasma source coupled to the load lock process chamber and the second load lock process chamber.

10. The process load lock apparatus of claim 8, comprising a common body having a vacuum port formed in the common body that is connected to both of the load lock process chamber and the second load lock process chamber.

11. The process load lock apparatus of claim 2, comprising a stationary pedestal heater.

12. The process load lock apparatus of claim 2, wherein the lift assembly includes
a frame including a pocket and the
containment ring supported by the pocket in the frame.

13. The process load lock apparatus of claims 2, wherein the load lock process chamber comprises the lift assembly including a moveable containment ring received in an annular shaped upper pocket formed radially outward from a showerhead.

14. The process load lock apparatus of claims 13, wherein the containment ring comprises quartz or alumina.

15. A method of processing substrates using the process load lock apparatus of claim 2, comprising:
providing the mainframe section including a robot;
providing the factory interface adjacent to the mainframe section adapted to receive substrates from load ports;
providing the process load lock apparatus located between the mainframe and the factory interface, the process load lock apparatus including
load lock chamber coupled between the mainframe section and the factory interface at a first level, and
the load lock process chamber at a second different level; and
carrying out a process on the substrate in the load lock processing chamber.

16. The method of claim 15, wherein the process on the substrate comprises an oxide removal.

17. The method of claim 15, wherein the process on the substrate comprises copper oxide removal.

* * * * *